United States Patent
Ueda et al.

(10) Patent No.: US 12,122,900 B2
(45) Date of Patent: Oct. 22, 2024

(54) ELECTROMAGNETIC WAVE SHIELDING MOLDED ARTICLE

(71) Applicant: DAICEL POLYMER LTD., Tokyo (JP)

(72) Inventors: Takafumi Ueda, Tokyo (JP); Hirotomo Katano, Tokyo (JP); Hiroshi Katayama, Tokyo (JP)

(73) Assignee: DAICEL POLYMER LTD., Tokyo (JP)

( * ) Notice: Subject to any disclaimer, the term of this patent is extended or adjusted under 35 U.S.C. 154(b) by 425 days.

(21) Appl. No.: 16/760,089

(22) PCT Filed: Oct. 30, 2018

(86) PCT No.: PCT/JP2018/040243
§ 371 (c)(1),
(2) Date: Apr. 29, 2020

(87) PCT Pub. No.: WO2019/088062
PCT Pub. Date: May 9, 2019

(65) Prior Publication Data
US 2021/0371623 A1    Dec. 2, 2021

(30) Foreign Application Priority Data

Oct. 30, 2017  (JP) ................................ 2017-209052
Oct. 30, 2017  (JP) ................................ 2017-209054
(Continued)

(51) Int. Cl.
*C08K 7/06*    (2006.01)
*C08F 110/06*  (2006.01)
(Continued)

(52) U.S. Cl.
CPC .............. *C08K 7/06* (2013.01); *C08F 110/06* (2013.01); *C08K 3/04* (2013.01); *C08L 23/12* (2013.01);
(Continued)

(58) Field of Classification Search
CPC . H01Q 17/00; H05K 9/0081; C08K 2201/004
See application file for complete search history.

(56) References Cited

U.S. PATENT DOCUMENTS 6,051,307 A *  4/2000  Kido ........................ C08K 7/06
                                                          264/105
6,202,883 B1 *  3/2001  Narazaki ........... H01L 21/67333
                                                          206/706
(Continued)

FOREIGN PATENT DOCUMENTS

EP    3 006 510 A1    4/2016
JP    2000-13090 A    1/2000
(Continued)

OTHER PUBLICATIONS

English translation of International Preliminary Report on Patentability and Written Opinion mailed May 14, 2020, in PCT/JP2018/040243 (Forms PCT/IB/338, PCT/IB/373, and PCT/ISA/237).
(Continued)

*Primary Examiner* — Alexander C Kollias
(74) *Attorney, Agent, or Firm* — Birch, Stewart, Kolasch & Birch, LLP

(57) ABSTRACT

Provided is an electromagnetic wave shielding and absorbing molded article which has an excellent shielding property and absorbency of electromagnetic waves of specific frequencies. The electromagnetic wave shielding and absorbing molded article includes a thermoplastic resin composition containing a thermoplastic resin and carbon fibers. The carbon fibers have a weighted average fiber length in the
(Continued)

molded article in a range from 0.05 to 8.0 mm, and the content ratio of the carbon fibers in the molded article is from 0.05 to 45 mass %. The electromagnetic wave shielding and absorbing molded article has a thickness from 0.01 mm to 5 mm, a shielding property of 10 dB or greater and an absorbency of 5% or greater for electromagnetic waves having any frequency in a frequency domain from 59 GHz to 100 GHz.

3 Claims, 1 Drawing Sheet

(30) Foreign Application Priority Data

| Mar. 9, 2018 | (JP) | ................................. | 2018-043080 |
| Mar. 9, 2018 | (JP) | ................................. | 2018-043082 |
| Oct. 15, 2018 | (JP) | ................................. | 2018-194175 |

(51) Int. Cl.
*C08K 3/04* (2006.01)
*C08L 23/12* (2006.01)
*H01Q 17/00* (2006.01)
*H05K 9/00* (2006.01)

(52) U.S. Cl.
CPC ............ *H01Q 17/00* (2013.01); *H05K 9/0081* (2013.01); *C08K 2201/004* (2013.01); *C08L 2205/025* (2013.01)

(56) References Cited

U.S. PATENT DOCUMENTS

| 2008/0071024 | A1* | 3/2008 | Morishita | ............... | C08L 77/00 |
| | | | | | 525/66 |
| 2015/0315371 | A1* | 11/2015 | Okunaka | ................. | B29C 48/05 |
| | | | | | 525/240 |
| 2016/0111792 | A1 | 4/2016 | Katayama et al. | | |
| 2016/0122513 | A1* | 5/2016 | Miyamoto | .............. | C08L 23/14 |
| | | | | | 252/511 |
| 2020/0010588 | A1* | 1/2020 | Kanaya | ..................... | C08F 8/46 |

FOREIGN PATENT DOCUMENTS

| JP | 2004-14990 | A | 1/2004 |
| JP | 2006-274061 | A | 10/2006 |
| JP | 2007-74662 | A | 3/2007 |
| JP | 2011-162905 | A | 8/2011 |
| JP | 2012-52093 | A | 3/2012 |
| JP | 2012-131104 | A | 7/2012 |
| JP | 2012-131918 | A | 7/2012 |
| JP | 2012-158648 | A | 8/2012 |
| JP | 2013-107979 | A | 6/2013 |
| JP | 2013-121988 | A | 6/2013 |
| JP | 2015-7216 | A | 1/2015 |
| JP | 6123502 | B2 | 5/2017 |

OTHER PUBLICATIONS

Extended European Search Report issued Jul. 16, 2021, in European Patent Application No. 18874925.3.

\* cited by examiner

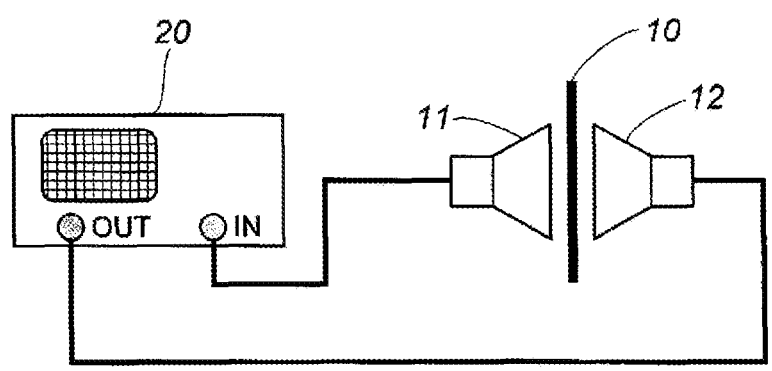

ELECTROMAGNETIC WAVE SHIELDING MOLDED ARTICLE

TECHNICAL FIELD

The present invention relates to an electromagnetic wave shielding and absorbing molded article having an advanced capability of shielding and absorbing electromagnetic waves having a specific wavelength.

BACKGROUND ART

A millimeter wave radar device used for the purpose of enabling automated driving and preventing collisions of automobiles is known. A millimeter wave radar device is mounted to various locations such as the front center, both sides, and both rear sides of a vehicle, and is provided with: a high frequency module with an antenna for transmitting and receiving radio waves installed, a control circuit for controlling the radio waves, a housing that houses the antenna and the control circuit, and a radome covering the transmission and reception of radio waves for the antenna (JP 2007-74662 A). A millimeter wave radar device thus constituted transmits and receives millimeter waves using the antenna, and can thereby detect relative distances and relative velocities with respect to an obstacle. The antenna may also receive radio waves reflected from a road surface or other objects besides a target obstacle, and thus there is a risk that the detection accuracy of the device may be reduced. In order to solve this problem, the millimeter wave radar device according to JP 2007-74662 A is provided with a shielding member that shields radio waves between the antenna and the control circuit.

As an invention for solving the problems of the invention of JP 2007-74662 A, a thermoplastic resin composition containing long carbon fibers with a fiber length of from 3 to 30 mm, and a molded article that is obtained therefrom and exhibits performance of shielding millimeter waves are proposed (JP 2015-7216 A). In addition, an invention has been proposed with favorable electromagnetic wave shielding properties of a thermoplastic resin molded article containing carbon fibers having an average length of from 0.5 to 15 mm (JP 6123502 B).

SUMMARY OF INVENTION

An object of the present invention is to provide an electromagnetic wave shielding and absorbing molded article excelling in a shielding property and an absorbency for electromagnetic waves having a specific frequency.

The present invention provides an electromagnetic wave shielding and absorbing molded article including a thermoplastic resin composition that contains a thermoplastic resin and carbon fibers, the carbon fibers having a weighted average fiber length in the molded article in a range from 0.05 to 8.0 mm, and a content ratio of the carbon fibers in the molded article being from 0.05 to 45 mass %, where the electromagnetic wave shielding and absorbing molded article has a thickness from 0.01 mm to 5 mm, and a shielding property of 10 dB or greater and an absorbency of 5% or greater for electromagnetic waves having any frequency in a frequency domain from 59 GHz to 100 GHz.

The present invention also provides an electromagnetic wave shielding and absorbing molded article including a thermoplastic resin composition that contains a thermoplastic resin and carbon fibers, the carbon fibers having a weighted average fiber length in the molded article in a range from 0.05 to less than 1.05 mm, and a content ratio of the carbon fibers in the molded article being from 0.1 to 20 mass %, where the electromagnetic wave shielding and absorbing molded article has a thickness of from 0.01 mm to 5 mm, and a shielding property of 10 dB or greater and an absorbency of 25% or greater for electromagnetic waves having any frequency in a frequency domain from 59 GHz to 100 GHz.

The present invention also provides an electromagnetic wave shielding and absorbing molded article including a thermoplastic resin composition that contains a thermoplastic resin and carbon fibers, the carbon fibers having a weighted average fiber length in the molded article in a range from 1.05 to 8.0 mm, and a content ratio of the carbon fibers in the molded article being from 0.05 to 45 mass %, where the electromagnetic wave shielding and absorbing molded article has a thickness from 0.1 mm to 5 mm, and a shielding property of 30 dB or greater and an absorbency of 5% or greater for electromagnetic waves having any frequency in a frequency domain from 59 GHz to 100 GHz.

The electromagnetic wave shielding property according to the present invention exhibits a combined performance for both absorbency and reflectivity with respect to electromagnetic waves.

The electromagnetic wave shielding and absorbing molded article according to the present invention uses carbon fibers, which can increase both the shielding property and the absorbency for electromagnetic waves having a specific frequency. Furthermore, by using short carbon fibers and long carbon fibers, the electromagnetic wave shielding and absorbing molded article according to the present invention can increase both the shielding property and the absorbency for any electromagnetic waves having the frequency domain from 59 GHz to 100 GHz.

BRIEF DESCRIPTION OF DRAWINGS

FIG. 1 is a schematic diagram of device that was used in the examples to measure the electromagnetic wave shielding property.

DESCRIPTION OF EMBODIMENTS

<Thermoplastic Resin Composition>

A thermoplastic resin composition according to an embodiment of the present invention contains a predetermined amount of a combination of a thermoplastic resin and carbon fibers, and preferably uses a predetermined amount of short fibers or a predetermined amount of long fibers as the carbon fibers in order to obtain the combined performance of both a shielding property and an absorbency for electromagnetic waves.

One or more thermoplastic resins selected from polypropylenes, propylene unit-containing copolymers and modified products of the copolymers (acid-modified products having a carboxyl group or a carbonyl group), styrene-based resins, polyphenylene sulfides, polyamides, polyethylene terephthalates, polybutylene terephthalates, and polycarbonates can be used, and the thermoplastic resin is preferably one or more selected from polypropylenes, and propylene unit-containing copolymers and modified products of the copolymers (acid-modified products having a carboxyl group or a carbonyl group), and is more preferably a polypropylene.

When a thermoplastic resin (except for an acid-modified product having a carboxyl group or a carbonyl group) and an acid-modified product having a carboxyl group or a carbonyl group (such as maleic acid-modified polypropylene) are used in combination, the adhesion between the thermoplastic resin and the carbon fibers (short fibers or long fibers) in the molded article is improved, and thus such combined use is preferable. However, depending on the content amount of the carbon fibers, the thermoplastic resin composition may be configured not containing an acid-modified product having a carboxyl group or a carbonyl group (such as maleic acid-modified polypropylene).

As the styrene-based resin, a polystyrene or a copolymer containing a styrene unit (such as AS resin, ABS resin, ASA resin, AES resin, and MAS resin) can be used.

When short fibers are used for the carbon fibers, the weighted average fiber length in the electromagnetic wave shielding and absorbing molded article preferably ranges from 0.05 mm to less than 1.05 mm, and preferably ranges from 0.05 to 1.0 mm, and more preferably from 0.1 to 0.7 mm.

A content ratio of carbon fibers (short fibers) in the composition (the electromagnetic wave shielding and absorbing molded article) is from 0.1 to 20 mass %, and is preferably from 0.1 to 15 mass %. When the content ratio of carbon fibers (short fibers) in the composition (the electromagnetic wave shielding and absorbing molded article) is from 0.1 to 10 mass %, and preferably when the content ratio is from 0.1 to 5 mass %, the shielding property and the absorbency can be increased even when a thermoplastic resin (except for an acid-modified product having a carboxyl group or a carbonyl group) and an acid-modified product (such as a maleic acid-modified polypropylene) having a carboxyl group or a carbonyl group are not used in combination.

When short fibers are used for the carbon fibers, the ratio of carbon fibers having a fiber length of 0.5 mm or greater in the electromagnetic wave shielding and absorbing molded article is preferably 70 mass % or less. However, when a thermoplastic resin (excluding an acid-modified product having a carboxyl group or a carbonyl group) and an acid-modified product having a carboxyl group or a carbonyl group are not used in combination, the ratio of carbon fibers having a fiber length of 0.5 mm or longer in the electromagnetic wave shielding and absorbing molded article can also include a ratio exceeding 70 mass %.

When long fibers are used for the carbon fibers, the weighted average fiber length in the electromagnetic wave shielding and absorbing molded article preferably ranges from 1.05 to 8.0 mm, more preferably from 1.05 to 6.0 mm, even more preferably from 1.05 to 5.0 mm, and yet even more preferably from 1.05 to 4.0 mm.

Carbon fibers (long fibers) can be used in the form of long fiber pellets of resin-impregnated fiber bundles in which a thermoplastic resin is used. For the long fiber pellets of resin-impregnated fiber bundles, for example, a product obtained by impregnating and integrating a molten thermoplastic resin into carbon fibers in a bundled state with the carbon fibers aligned in the lengthwise direction, can be cut to a length ranging from 2 to 30 mm, and preferably from 3 to 15 mm, and then used. The method for producing the long fiber pellets of resin-impregnated fiber bundles in which a thermoplastic resin is used is a well-known method, and for example, those long fiber pellets can be produced using the methods described in JP 2013-107979 A (production of resin-impregnated long glass fiber bundles of Production Example 1), JP 2013-121988 A (production of resin-impregnated long glass fiber bundles of Production Example 1), JP 2012-52093 A (Examples 1 to 9), JP 2012-131104 A (production of resin-impregnated long glass fiber bundles of Production Example 1, production of long fiber bundles of resin-impregnated carbon fibers of Production Example 2), JP 2012-131918 A (production of resin-impregnated carbon fiber bundles of Production Example 1, production of resin-impregnated glass fiber bundles of Production Example 2), JP 2011-162905 A (Example 1), and JP 2004-14990 A (Examples 1 to 7).

The content ratio of carbon fibers (long fibers) in the composition (the electromagnetic wave shielding and absorbing molded article) is preferably from 0.05 to 45 mass %, more preferably from 0.1 to 45 mass %, even more preferably from 0.1 to 10 mass %, and yet even more preferably from 0.5 to 5 mass %. When the content amount of carbon fibers (long fibers) is small, the mechanical strength of the electromagnetic wave shielding and absorbing molded article can be increased by containing an inorganic filler (such as glass fibers or talc). Note that when the content ratio of carbon fibers (long fibers) in the composition (the electromagnetic wave shielding and absorbing molded article) is from 0.1 to 10 mass %, and preferably when the content ratio is from 0.5 to 5 mass %, the shielding property and the absorbency can be increased even when a thermoplastic resin (except for an acid-modified product having a carboxyl group or a carbonyl group) and an acid-modified product (such as a maleic acid-modified polypropylene) having a carboxyl group or a carbonyl group are not used in combination.

The thermoplastic resin composition to be used in the present invention can contain a known resin additive within a range at which the problem of the present invention can be solved. Examples of known resin additives include stabilizers against heat, light, UV light, and the like, lubricants, nucleating agents, plasticizers, known inorganic and organic fillers (excluding carbon fibers), antistatic agents, release agents, flame retardants, softeners, dispersants, antioxidants, and coloring materials. The total content ratio of the above-mentioned known resin additives in the composition (the electromagnetic wave shielding and absorbing molded article) is preferably 5 mass % or less, more preferably 3 mass % or less, even more preferably 1 mass % or less, and yet even more preferably 0.5 mass % or less.

<Electromagnetic Wave Shielding and Absorbing Molded Article>

The electromagnetic wave shielding and absorbing molded article according to an embodiment of the present invention is obtained by molding the thermoplastic resin composition described above through application of a known resin molding method such as injection molding. The size and shape of the electromagnetic wave shielding and absorbing molded article according to an embodiment of the present invention can be appropriately adjusted, according to its application, within a range that satisfies the following thickness requirement.

When short fibers are used for the carbon fibers, the electromagnetic wave shielding and absorbing molded article according to an embodiment of the present invention preferably has a thickness from 0.01 mm to 5 mm, more preferably from 0.05 mm to 5 mm, and even more preferably from 0.1 mm to 4 mm. The thickness is measured by a method described in the examples.

When long fibers are used for the carbon fibers, the electromagnetic wave shielding and absorbing molded article according to an embodiment of the present invention preferably has a thickness from 0.1 mm to 5 mm, more preferably from 0.5 mm to 5 mm, and even more preferably from 0.5 mm to 4 mm. The thickness is measured by the method described in the examples.

When short fibers are used for the carbon fibers, with the electromagnetic wave shielding and absorbing molded article according to an embodiment of the present invention, the shielding property is preferably 10 dB or higher and the electromagnetic wave absorbency is preferably 25% or greater for electromagnetic waves having any frequency in a frequency domain from 59 GHz to 100 GHz. When short fibers are used for the carbon fibers, both the electromagnetic wave shielding property and the electromagnetic wave absorbency for the electromagnetic wave shielding and absorbing molded article according to an embodiment of the present invention preferably satisfy the electromagnetic wave shielding property and the electromagnetic wave absorbency described above for an entire frequency range from 75 GHz to 95 GHz, and more preferably for an entire frequency range from 59 GHz to 100 GHz.

When short fibers are used for the carbon fibers, the electromagnetic wave shielding property and the electromagnetic wave absorbency of the electromagnetic wave shielding and absorbing molded article according to an embodiment of the present invention can be adjusted by adjusting a content ratio (R) and a thickness (T) of the carbon fibers. Note that the weighted average fiber length of the carbon fibers remaining in the molded article preferably ranges from 0.1 to 1.0 mm.

When short fibers are used for the carbon fibers, and the electromagnetic wave shielding and absorbing molded article according to an embodiment of the present invention has (R) ranging from 0.5 to 20 mass %, which is a content ratio of carbon fibers in the molded article, (T) ranging from 0.1 mm to 5 mm, which is a thickness of the molded article, and (R·T) ranging from 1.5 to 35, which is a product of (R) and (T), the shielding property can be preferably set to 30 dB or greater and the absorbency can be preferably set to 25% or greater with respect to electromagnetic waves for any frequency in a frequency domain from 59 GHz to 100 GHz, or for an entire frequency domain from 75 GHz to 95 GHz.

When short fibers are used for the carbon fibers, and the electromagnetic wave shielding and absorbing molded article according to an embodiment of the present invention has (R) ranging from 0.1 to 20 mass %, which is a content ratio of carbon fibers in the molded article, (T) ranging from 0.01 mm to 5 mm, which is a thickness of the molded article, and (R·T) ranging from 0.1 to 1.0, which is a product of (R) and (T), the shielding property can be preferably set to 5 dB to less than 30 dB, and more preferably set to 10 dB to 25 dB and the absorbency can be can be set to preferably 40% or greater, more preferably 50% or greater, and even more preferably 60% or greater for electromagnetic waves having any frequency in the frequency domain from 59 GHz to 100 GHz.

When long fibers are used for the carbon fibers, with the electromagnetic wave shielding and absorbing molded article according to an embodiment of the present invention, the shielding property for electromagnetic waves having any frequency in a frequency domain from 59 GHz to 100 GHz can be preferably 30 dB or greater, more preferably to 40 dB or greater, even more preferably to 50 dB or greater, and yet even more preferably to 60 dB or greater.

Furthermore, when long fibers are used for the carbon fibers, with the electromagnetic wave shielding and absorbing molded article according to an embodiment of the present invention, the electromagnetic wave absorbency at any frequency in a frequency domain from 59 GHz to 100 GHz can be 5% or greater, preferably 7% or greater, and more preferably 10% or greater.

When long fibers are used for the carbon fibers, both the electromagnetic wave shielding property and the electromagnetic wave absorbency of the electromagnetic wave shielding and absorbing molded article according to an embodiment of the present invention satisfy the electromagnetic wave shielding property and the electromagnetic wave absorbency described above, which is preferably for an entire frequency range from 75 GHz to 82 GHz, and more preferably for an entire frequency range from 70 GHz to 85 GHz.

When long fibers are used for the carbon fibers, the electromagnetic wave shielding property and the electromagnetic wave absorbency of the electromagnetic wave shielding and absorbing molded article according to an embodiment of the present invention can be adjusted by adjusting the content ratio (R) and the thickness (T) of the carbon fibers. Note that the weighted average fiber length of the carbon fibers remaining in the molded article preferably ranges from 1.05 to 4.0 mm.

When long fibers are used for the carbon fibers, and the electromagnetic wave shielding and absorbing molded article according to an embodiment of the present invention has a product (R·T) of the content ratio (R) of carbon fibers in the molded article (composition) and a thickness (T) of the molded article ranging preferably from 0.05 to 16, more preferably from 0.5 to less than 10, and preferably from 1 to 8, the electromagnetic wave shielding property in an entire range of frequencies from 70 GHz to 100 GHz can be 40 dB or greater, and the electromagnetic wave absorbency in the entire range thereof can be 10% or higher, and preferably 20% or higher.

When long fibers are used for the carbon fibers, and the electromagnetic wave shielding and absorbing molded article according to an embodiment of the present invention has a range of a product (R·T) of the content ratio (R) of carbon fibers in the molded article (composition) and the thickness (T) of the molded article of greater than 16, and preferably from 18 to 100, the electromagnetic wave shielding property in the entire range of frequencies from 70 GHz to 100 GHz can be 70 dB or greater, and the electromagnetic wave absorbency can be 2% or greater.

EXAMPLES (1) Weighted Average Fiber Length

Approximately 3 g of a sample was cut out from a molded article, and the resin was fired to extract the carbon fibers. The weighted average fiber length was determined from data obtained by measuring some of the extracted carbon fibers (500 fibers) using a LUZEX AP (available from Nireco Corporation). The calculation steps described in paragraphs [0044] and [0045] of JP 2006-274061 A were used to calculate the weighted average fiber length. The ratio (quantity ratio) of carbon fibers of 0.5 mm or longer in the molded article was determined from the aforementioned method and is shown in Tables 1 and 2.

(2) Thickness (mm)

The thickness at a center portion (portion of intersection of diagonal lines) of a flat electromagnetic wave shielding and absorbing molded article (150×150 mm) was measured.

(3) Tensile Nominal Strain (%)

The tensile nominal strain was measured according to ISO527.

(4) Electromagnetic Wave Shielding Property and Electromagnetic Wave Absorbency

The measurement device illustrated in FIG. 1 was used. A molded article 10 (length of 150 mm, width of 150 mm, thickness indicated in the table) to be measured was held between a pair of horizontally opposing antennas (corrugated horn antennas) 11, 12. The spacing between the antenna 12 and the molded article 10 was 0 mm, and the spacing between the molded article 10 and the antenna 11 was 0 mm. In this state, electromagnetic waves (65 to 110 GHz) were radiated from the lower antenna 12, electromagnetic waves transmitted through the molded article 10 to be measured were received by the upper antenna 11, the electromagnetic wave shielding property (the penetration inhibition of radiated waves) was calculated from equations 1 and 2 below, and the electromagnetic wave absorbency was calculated from the equations 3 to 6 below. Furthermore, for the molded articles of Examples 2 and 7, the electromagnetic wave shielding property when electromagnetic waves (from 1 to 18 GHz) were emitted was also determined as follows using the measuring device illustrated in FIG. 1. The molded article 10 (length of 150 mm, width of 150 mm, thickness of 2 mm) to be measured was held between a pair of vertically facing antennas (wide band antennas; Schwarzbeck Mess-Elektronik, BBHA9120A, from 2 to 18 GHz) 11, 12. The spacing between the antenna 12 and the molded article 10 was 85 mm, and the spacing between the molded article 10 and the antenna 11 was 10 mm. In this state, electromagnetic waves (from 1 to 18 GHz) were radiated from the lower antenna 12, electromagnetic waves transmitted through the molded article 10 to be measured were received by the upper antenna 11, and the electromagnetic wave shielding property (the penetration inhibition of radiated waves) was calculated from Equations 1 and 2 below.

Electromagnetic Wave Shielding Property (dB)=20 log(1/|$s_{21}$|)   (Equation 1)

$S_{21}$=(Transmitted Electric Field Intensity)/(Incident Electric Field Intensity)   (Equation 2)

In Equation 1, $S_{21}$ represents an S parameter (equation (2)) showing a ratio of a transmitted electric field intensity to an incident electric field intensity, and can be measured using a network analyzer 20. In equation 1, the logarithm of the reciprocal of the S parameter was used to express the electromagnetic wave shielding property (dB) as a positive value. With the measurement device of FIG. 1, a range of from 0 to approximately 100 dB can be measured. Cases in which the electromagnetic wave shielding property exceeded 80 dB are indicated in the table by ">80 (dB)", and cases in which the electromagnetic wave shielding property was less than 10 dB are indicated in the table by "10>(dB)".

$S_{11}$=(Reflected Electric Field Intensity)/(Incident Electric Field Intensity)   (Equation 3)

In Equation 3, $S_{11}$ represent an S parameter showing a ratio of the reflected electric field intensity to the incident electric field intensity, and similar to $S_{21}$, can be measured using the network analyzer. The absorptivity was denoted as a percentage as expressed by the following formula on a basis of power. The absorptivity is shown in the table as electromagnetic wave absorbency.

Transmittance (%)=$S_{21}^2$×100   (Equation 4)

Reflectance (%)=$S_{11}^2$×100   (Equation 5)

Absorptivity (%)=100−Transmittance−Reflectance   (Equation 6)

<Components Used>
(Thermoplastic Resin)
PP: polypropylene homopolymer, trade name "PM900A", available from SunAllomer Ltd.
Acid-modified PP: maleic anhydride modified polypropylene, trade name "OREVAC CA100", maleic acid 1.0 mass % modification, available from Arkema K.K.
PP2: SunAllomer PMB60A (block PP, available from SunAllomer Ltd.)
PP3: Prime Polypro 5119 (available from Prime Polymer Co., Ltd., homo PP)
(Carbon Fibers)
Carbon fibers: trade name "CFU-HC", available from Nippon Polymer Sangyo Co., Ltd.

Sizing agent treated carbon fiber roving: Pellets PP1 produced in Production Example 1 using Torayca T700SC-12000-50C (available from Toray Industries, Inc., treated with an epoxy sizing agent)
(Other)
Stabilizer 1: phenol-based stabilizer, trade name "ADK STAB A0-60", available from ADEKA Corporation
Stabilizer 2: sulfur-based stabilizer, trade name "TOWREX A0180T", available from TOWREX
Lubricant: calcium stearate, trade name "SC-PG", available from Sakai Chemical Industry Co., Ltd.

Production Example 1

The sizing agent treated carbon fiber roving was subjected to heating at 150° C. by a pre-heating device, and passed through a crosshead die. At that time, molten polypropylene (mixture of PP3: acid-modified PP=85:15 (mass ratio)) was supplied to the crosshead die from a twin screw extruder (cylinder temperature: 280° C.), and the fiber bundles were impregnated with the polypropylene. Next, the material was shaped with a shaping nozzle at the outlet of the crosshead die, and the shape was further refined with a shape refining roll, after which the sample was cut to a predetermined length using a pelletizer to obtain pellets (cylindrical molded articles) PP1 (containing 40 mass % of long carbon fibers) with a length of 8 mm. The length of the long carbon fibers was the same as the pellet length. In the pellets PP1 obtained in this manner, the long carbon fibers were substantially parallel in the length direction.

Production Example 2

The sizing agent treated carbon fiber roving was subjected to heating at 150° C. by a pre-heating device, and passed through a crosshead die. At that time, molten polypropylene (PP3 was used, acid-modified PP was not contained) was supplied to the crosshead die from a twin screw extruder, cylinder temperature: 280° C.), and the fiber bundles were impregnated with the polypropylene. Next, the material was shaped with a shaping nozzle at the outlet of the crosshead die, and the shape was further refined with a shape refining roll, after which the sample was cut to a predetermined length using a pelletizer to obtain pellets (cylindrical molded articles) PP4 (containing 40 mass % of long carbon fibers) with a length of 8 mm. The length of the long carbon fibers was the same as the pellet length. In the pellets PP4 obtained in this manner, the long carbon fibers were substantially parallel in the length direction.

Examples 1 to 19 and Comparative Examples 1 and 2

The components shown in Table 1 and Table 2 were dry blended, after which pellets (thermoplastic resin composition) were produced using an extruder (TEX30α, Japan Steel Works, Ltd.). The obtained pellets were then used and molded using an injection molding machine (α-150iA, available from Fanuc Corporation) at a molding temperature of 220° C. and a mold temperature of 50° C., and flat plate shaped electromagnetic wave shielding and absorbing molded articles (150×150 mm) according to an embodiment of the present invention were obtained. The obtained electromagnetic wave shielding and absorbing molded articles were used, and the various measurements shown in Tables 1 and 2 were performed.

TABLE 1

|  |  | Units | Examples | | | | | | | | | | | |
|---|---|---|---|---|---|---|---|---|---|---|---|---|---|---|
|  |  |  | 1 | 2 | 3 | 4 | 5 | 6 | 7 | 8 | 9 | 10 | 11 | 12 |
| Composition | PP | mass % | 96.0 | 95.5 | 95.5 | 94.5 | 94.5 | 93.5 | 93.5 | 93.5 | 91.6 | 91.6 | 86.8 | 82.0 |
|  | Acid-modified PP | mass % | 3.0 | 3.0 | 3.0 | 3.0 | 3.0 | 3.0 | 3.0 | 3.0 | 2.9 | 2.9 | 2.7 | 2.5 |
|  | Stabilizer 1 | mass % | 0.2 | 0.2 | 0.2 | 0.2 | 0.2 | 0.2 | 0.2 | 0.2 | 0.2 | 0.2 | 0.2 | 0.2 |
|  | Stabilizer 2 | mass % | 0.2 | 0.2 | 0.2 | 0.2 | 0.2 | 0.2 | 0.2 | 0.2 | 0.2 | 0.2 | 0.2 | 0.2 |
|  | Lubricant | mass % | 0.1 | 0.1 | 0.1 | 0.1 | 0.1 | 0.1 | 0.1 | 0.1 | 0.1 | 0.1 | 0.1 | 0.1 |
|  | Carbon fiber ratio (R) | mass % | 0.5 | 1 | 1 | 2 | 2 | 3 | 3 | 3 | 5 | 5 | 10 | 15 |
|  | Total | mass % | 100 | | | | | | | | | | | |
| Molded Article | Weighted average fiber length — Weighted Average | mm | 0.7 | 0.6 | 0.6 | 0.7 | 0.7 | 0.7 | 0.7 | 0.7 | 0.7 | 0.7 | 0.6 | 0.6 |
|  | Ratio for 0.5 mm or greater | mass % | 58 | 50 | 50 | 64 | 64 | 68 | 68 | 69 | 69 | 69 | 62 | 50 |
|  | Thickness (T) | mm | 4 | 2 | 4 | 2 | 4 | 0.5 | 2 | 4 | 2 | 4 | 2 | 2 |
|  | R · T | — | 2 | 2 | 4 | 4 | 8 | 1.5 | 6 | 12 | 10 | 20 | 20 | 30 |
|  | Tensile nominal strain (4 mm thickness) | % | 8.9 | 7.8 | 7.8 | 6.4 | 6.4 | 6.1 | 6.1 | 6.1 | 4.8 | 4.8 | 1.8 | 1.0 |
|  | Shielding property (dB) 2 GHz |  |  | 10> |  |  |  |  | 17 |  |  |  |  |  |
|  | 10 GHz |  |  | 10> |  |  |  |  | 21 |  |  |  |  |  |
|  | 70 GHz |  | 30 | 51 | >80 | 77 | >80 | 38 | >80 | >80 | >80 | >80 | >80 | >80 |
|  | 76 GHz |  | 31 | 57 | >80 | 79 | >80 | 39 | >80 | >80 | >80 | >80 | >80 | >80 |
|  | 79 GHz |  | 33 | 60 | >80 | 80 | >80 | 40 | >80 | >80 | >80 | >80 | >80 | >80 |
|  | 85 GHz |  | 35 | 66 | >80 | >80 | >80 | 43 | >80 | >80 | >80 | >80 | >80 | >80 |
|  | 95 GHz |  | 39 | >80 | >80 | >80 | >80 | 48 | >80 | >80 | >80 | >80 | >80 | >80 |
|  | 100 GHz |  | 40 | >80 | >80 | >80 | >80 | 48 | >80 | >80 | >80 | >80 | >80 | >80 |
|  | Absorbency (%) 70 GHz |  | 87.9 | 62 | 62 | 53 | 49 | 37 | 38 | 48 | 35 | 30 | 26 | 26 |
|  | 76 GHz |  | 87.7 | 61 | 61 | 51 | 47 | 36 | 46 | 45 | 43 | 29 | 32 | 32 |
|  | 79 GHz |  | 86.0 | 59 | 59 | 49 | 44 | 33 | 50 | 42 | 47 | 26 | 36 | 36 |
|  | 85 GHz |  | 86.2 | 61 | 62 | 53 | 47 | 38 | 53 | 46 | 49 | 29 | 39 | 39 |
|  | 95 GHz |  | 89.7 | 69 | 69 | 62 | 57 | 62 | 72 | 56 | 69 | 43 | 56 | 57 |
|  | 100 GHz |  | 83.9 | 61 | 61 | 52 | 46 | 62 | 69 | 44 | 66 | 31 | 53 | 52 |

TABLE 2

|  |  | Units | Examples | | | | | | | Comparative Examples | |
|---|---|---|---|---|---|---|---|---|---|---|---|
|  |  |  | 13 | 14 | 15 | 16 | 17 | 18 | 19 | 1 | 2 |
| Composition | PP | mass % | 96.4 | 96.4 | 93.5 | 91.6 | 99.4 | 98.5 | 94.5 | 67.4 | 96.3 |
|  | Acid-modified PP | mass % | 3.0 | 3.0 | 3.0 | 2.9 | — | — | — | 2.1 | 3.0 |
|  | Stabilizer 1 | mass % | 0.2 | 0.2 | 0.2 | 0.2 | 0.2 | 0.2 | 0.2 | 0.2 | 0.3 |
|  | Stabilizer 2 | mass % | 0.2 | 0.2 | 0.2 | 0.2 | 0.2 | 0.2 | 0.2 | 0.2 | 0.3 |
|  | Lubricant | mass % | 0.1 | 0.1 | 0.1 | 0.1 | 0.1 | 0.1 | 0.1 | 0.1 | 0.1 |
|  | Carbon fiber ratio (R) | mass % | 0.1 | 0.1 | 3 | 5 | 0.1 | 1.0 | 5.0 | 30 | 0 |
|  | Total | mass % | 100 | | | | | | | 100 | |
| Molded Article | Weighted average fiber length — Weighted Average | mm | 0.6 | 0.6 | 0.7 | 0.7 | 0.85 | 0.85 | 0.80 | 0.3 | — |
|  | Ratio for 0.5 mm or greater | mass % | 60 | 60 | 68 | 69 | 75 | 73 | 71 | 4 | — |
|  | Thickness (T) | mm | 2 | 4 | 0.1 | 0.1 | 2 | 2 | 2 | 2 | 2 |
|  | R · T | — | 0.2 | 0.4 | 0.3 | 0.5 | 0.2 | 2 | 10 | 60 | 0 |
|  | Tensile nominal strain (4 mm thickness) | % | 14.9 | 14.9 | 6.1 | 4.8 | 18.0 | 10.0 | 5.0 | 0.7 | 15 |
|  | Shielding property (dB) 70 GHz |  | 11 | 12 | 15 | 19 | 16 | 60 | >80 | >80 | 0 |
|  | 76 GHz |  | 12 | 14 | 15 | 18 | 17 | 61 | >80 | >80 | 0 |
|  | 79 GHz |  | 13 | 14 | 15 | 18 | 18 | 63 | >80 | >80 | 0 |
|  | 85 GHz |  | 14 | 16 | 15 | 19 | 19 | 70 | >80 | >80 | 0 |
|  | 95 GHz |  | 16 | 18 | 16 | 20 | 21 | >80 | >80 | >80 | 0 |
|  | 100 GHz |  | 16 | 18 | 16 | 20 | 21 | >80 | >80 | >80 | 0 |
|  | Absorbency (%) 70 GHz |  | 86.1 | 88.6 | 62 | 54 | 83.0 | 59 | 33 | 24 | 0 |
|  | 76 GHz |  | 88.4 | 87.0 | 58 | 48 | 85.0 | 59 | 41 | 29 | 0 |
|  | 79 GHz |  | 88.6 | 85.9 | 55 | 46 | 87.0 | 57 | 45 | 36 | 0 |
|  | 85 GHz |  | 90.4 | 88.9 | 54 | 48 | 88.0 | 59 | 46 | 40 | 0 |
|  | 95 GHz |  | 93.5 | 96.1 | 61 | 55 | 91.0 | 66 | 66 | 60 | 0 |
|  | 100 GHz |  | 90.5 | 94.9 | 55 | 48 | 90.0 | 59 | 65 | 57 | 0 |

In Examples 1 to 16, the weighted average fiber length (weighted average value) of the carbon fibers in the molded article was short at 1 mm or less, but by associating the content ratio (R) and the thickness (T) of the carbon fibers and adjusting to the appropriate range, it was possible to obtain a high electromagnetic wave shielding property and electromagnetic wave absorbency in a wide frequency domain. Note that the ratio (quantity ratio) of carbon fibers of 0.5 mm or longer in the molded articles of Examples 7, 9, 11 and 12 was 50% or greater, and the quantity ratio for the other remaining examples was also 50% or greater. In Examples 17 to 19, the content ratio of the carbon fibers was from 0.1 to 5.0 mass %, and an acid-modified PP was not used, but even compared to Examples 13 to 16 in which the same degree of carbon fibers was contained, Examples 17 to 19 exhibited comparable or higher shielding properties and absorbency. In Comparative Example 1, when the content amount of long carbon fibers was increased, a high electromagnetic wave shielding property was exhibited, but the electromagnetic wave absorbency was inferior to that of the examples. Moreover, Comparative Example 1 used 60-times or more the amount of carbon fibers compared to that of Example 1, and this high content amount is economically disadvantageous, and results in a large density, which is also disadvantageous in terms of weight reduction of the molded article. Comparative Example 2 did not contain carbon fibers, and as a result, did not provide any effect in shielding or absorbency.

Examples 20 to 33 and Comparative Example 3

Pellets of PP1 (pellets containing 40 mass % of the long carbon fibers obtained in Production Example 1; also containing acid-modified PP), PP2 (not containing carbon fibers), and PP4 (pellets containing 40 mass % of the long carbon fibers obtained in Production Example 2; not containing acid-modified PP) were dry blended at the ratios shown in Table 3, and molded at a molding temperature of 250° C. and a mold temperature of 50° C. using an injection molding machine (α-150iA; available from Fanuc Corporation), and flat plate shaped electromagnetic wave shielding and absorbing molded articles (150×150 mm) were obtained. The obtained electromagnetic wave shielding and absorbing molded articles were used, and the various measurements shown in Table 3 were performed.

TABLE 3

|  |  | Units | Examples ||||||||| Comparative Example |
|---|---|---|---|---|---|---|---|---|---|---|---|---|---|---|---|
|  |  |  | 20 | 21 | 22 | 23 | 24 | 25 | 28 | 27 | 28 | 29 | 30 | 31 | 32 | 33 | 3 |
| Composition | PP1 | mass % | 1.3 | 1.3 | 2.5 | 7.5 | 7.5 | 7.5 | 12.5 | 25.0 | 50.0 | 50.0 | 75.0 | 100.0 | — | — | — |
|  | PP2 | mass % | 98.7 | 98.7 | 97.5 | 92.5 | 92.5 | 92.5 | 87.5 | 75.0 | 50.0 | 50.0 | 25.0 | 0 | 98.7 | 92.5 | 100.0 |
|  | PP4 | mass % | — | — | — | — | — | — | — | — | — | — | — | — | 1.3 | 7.5 | — |
|  | Total | mass % | 100.0 |||||||| 100.0 |||| 100.0 ||
|  | Carbon fiber ratio (R) | mass % | 0.5 | 0.5 | 1 | 3 | 3 | 3 | 5 | 10 | 20 | 20 | 30 | 40 | 0.5 | 3 | 0 |
| Molded Article | Thickness (T) | mm | 2 | 4 | 2 | 0.5 | 2 | 4 | 2 | 2 | 0.5 | 2 | 2 | 2 | 2 | 0.5 | — |
|  | R · T | — | 1 | 2 | 2 | 1.5 | 6 | 12 | 10 | 20 | 10 | 40 | 60 | 80 | 1 | 1.5 | — |
|  | Weighted average fiber length (weighted average value) | mm | 3.14 | 3.14 | 2.79 | 2.63 | 2.63 | 2.63 | 2.42 | 2.93 | 2.05 | 2.35 | 1.70 | 1.05 | 3.30 | 2.73 | — |
|  | Shielding property (dB) | 2 GHz | 10> |  | 11 |  | 19 |  | 23 |  |  |  |  |  |  |  |  |
|  |  | 10 GHz | 10> |  | 12 |  | 19 |  | 26 |  |  |  |  |  |  |  |  |
|  |  | 70 GHz | 69 | >80 | >80 | 47 | >80 | >80 | >80 | >80 |  |  |  |  |  |  |  |
|  |  | 76 GHz | 70 | >80 | >80 | 48 | >80 | >80 | >80 | >80 |  |  |  |  |  |  |  |
|  |  | 79 GHz | 70 | >80 | >80 | 48 | >80 | >80 | >80 | >80 |  |  |  |  |  |  |  |
|  |  | 85 GHz | 72 | >80 | >80 | 50 | >80 | >80 | >80 | >80 |  |  |  |  |  |  |  |
|  |  | 95 GHz | 75 | >80 | >80 | 55 | >80 | >80 | >80 | >80 |  |  |  |  |  |  |  |
|  |  | 100 GHz | 76 | >80 | >80 | 55 | >80 | >80 | >80 | >80 |  |  |  |  |  |  |  |
|  | Absorbency (%) | 70 GHz | 52 | 51 | 43 | 30 | 29 | 27 | 25 | 7 |  |  |  |  |  |  |  |
|  |  | 76 GHz | 51 | 49 | 41 | 29 | 23 | 21 | 19 | 8 |  |  |  |  |  |  |  |
|  |  | 79 GHz | 49 | 47 | 38 | 25 | 20 | 17 | 14 | 9 |  |  |  |  |  |  |  |
|  |  | 85 GHz | 53 | 51 | 43 | 31 | 26 | 23 | 22 | 10 |  |  |  |  |  |  |  |
|  |  | 95 GHz | 63 | 60 | 55 | 60 | 37 | 34 | 32 | 4 |  |  |  |  |  |  |  |
|  |  | 100 GHz | 55 | 53 | 43 | 58 | 21 | 15 | 10 | 3 |  |  |  |  |  |  |  |

TABLE 3-continued

| | | | | | | | | |
|---|---|---|---|---|---|---|---|---|
| Shielding property (dB) | 2 GHz | | | | | 10> | | |
| | 10 GHz | | | | | 10> | | |
| | 70 GHz | >80 | >80 | >80 | >80 | 72 | 51 | 0 |
| | 76 GHz | >80 | >80 | >80 | >80 | 74 | 52 | 0 |
| | 79 GHz | >80 | >80 | >80 | >80 | 74 | 52 | 0 |
| | 85 GHz | >80 | >80 | >80 | >80 | 75 | 53 | 0 |
| | 95 GHz | >80 | >80 | >80 | >80 | 78 | 58 | 0 |
| | 100 GHz | >80 | >80 | >80 | >80 | 79 | 56 | 0 |
| Absorbency (%) | 70 GHz | 19 | 7 | 6 | 6 | 53 | 29 | 0 |
| | 76 GHz | 14 | 8 | 7 | 8 | 52 | 31 | 0 |
| | 79 GHz | 10 | 9 | 8 | 9 | 50 | 27 | 0 |
| | 85 GHz | 18 | 10 | 8 | 10 | 52 | 33 | 0 |
| | 95 GHz | 21 | 4 | 2 | 4 | 61 | 58 | 0 |
| | 100 GHz | 35 | 3 | 3 | 4 | 56 | 57 | 0 |

In Examples 20 to 31, the weighted average fiber length (weighted average value) of the carbon fibers in the molded article was 1.05 mm or longer, and by associating the content ratio (R) and the thickness (T) of the carbon fibers and adjusting to the appropriate range, it was possible to adjust the electromagnetic wave shielding property and the electromagnetic wave absorbency in a wide frequency domain. In Examples 32 and 33, the content ratio of the carbon fibers was from 0.5 to 3 mass %, and an acid-modified PP was not used, but even compared to Examples 20 to 25 in which the same degree of carbon fibers was contained, Examples 32 and 33 exhibited comparable or higher shielding properties and absorbency.

INDUSTRIAL APPLICABILITY

The electromagnetic wave shielding and absorbing molded article of the present invention can be used for a millimeter wave radar device loaded in a vehicle for the purpose of enabling automated driving of the vehicle and preventing collisions, and for example, can be used in a shielding member (protective member for a transmitting and receiving antenna) that shields radio waves between the shielding member and a transmitting and receiving antenna control circuit for millimeter wave radar, in a housing for a millimeter wave radar device, and in a member for attaching a millimeter wave radar device, and can also be used in a housing for electrical and electronic equipment for a vehicle or for a device other than a vehicle. Furthermore, the electromagnetic wave shielding and absorbing molded article of the present invention can be used as a protective member for a wireless LAN or broadband wireless access system, a communication satellite, simple radio communications, an on-board radar, or a position recognition system, and more specifically, can be used as a protective member that shields radio waves of a base station antenna, a remote radio head (RRH; radio transceiver device), a baseband unit (BBU) device, a base GaN power amplifier, an optical transceiver, or the like.

The invention claimed is:

1. An electromagnetic wave shielding and absorbing molded article comprising a thermoplastic resin composition that includes a thermoplastic resin and carbon fibers, the carbon fibers having a weighted average fiber length in the molded article in a range from 0.6-0.7 mm, and a content of the carbon fibers in the molded article is from 0.5 to 15 mass %,
   wherein the electromagnetic wave shielding and absorbing molded article has a thickness from 0.01 mm to 5 mm, and has a shielding property of 10 dB or greater and an absorbency of 5% or greater for electromagnetic waves having any frequency in a frequency domain from 59 GHz to 100 GHz,
   wherein a content of the carbon fibers in the molded article having a fiber length of 0.5 mm or longer is 70 mass % or less, and
   wherein the thermoplastic resin comprises a first thermoplastic resin that is acid-modified polypropylene and has a carboxyl group or a carbonyl group, and a second thermoplastic resin that is polypropylene,
      wherein an amount of the acid-modified polypropylene is from 2.5 to 3.0 mass %, and
      wherein an amount of the polypropylene is from 82.0 to 96.4 mass %.

2. The electromagnetic wave shielding and absorbing molded article according to claim 1, wherein the electromagnetic shielding and absorbing molded article is a protective member for a transmitting and receiving antenna.

3. The electromagnetic wave shielding and absorbing molded article according to claim 1, wherein a content ratio of carbon fibers in the molded article is set as R, a thickness of the molded article is set as T, and a range of (R·T) is 1.5-35.

* * * * *